(12) United States Patent
Tung et al.

(10) Patent No.: US 7,443,673 B2
(45) Date of Patent: Oct. 28, 2008

(54) COOLING FUNCTION POWER ADAPTER

(76) Inventors: Kung-Chao Tung, 1F, No. 24, Cidong St., Jhongjheng District, Taipei City (TW) 100; Po-Cheng Tung, 6711 Danridge Dr., San Jose, CA (US) 95129

( * ) Notice: Subject to any disclaimer, the term of this patent is extended or adjusted under 35 U.S.C. 154(b) by 128 days.

(21) Appl. No.: 11/462,960

(22) Filed: Aug. 7, 2006

(65) Prior Publication Data
US 2008/0030950 A1 Feb. 7, 2008

(51) Int. Cl.
*H05K 7/20* (2006.01)
*H01L 23/36* (2006.01)

(52) U.S. Cl. .................. 361/695; 361/690; 361/694; 165/80.2; 165/104.33

(58) Field of Classification Search ......... 361/690–697, 361/715; 174/35 GC, 35 R, 17 R, 17 VA; 165/104.33, 121–126, 185; 454/184–186; 307/64, 66, 72–75, 82, 144–147, 150
See application file for complete search history.

(56) References Cited

U.S. PATENT DOCUMENTS 4,383,286 A * 5/1983 Hicks .................... 361/695
6,081,425 A * 6/2000 Cheng ................... 361/704
6,307,746 B1 * 10/2001 Beckman ............... 361/687
6,912,123 B2 * 6/2005 Sakai et al. ............. 361/683
6,989,592 B2 * 1/2006 Chang et al. ............ 257/707
7,177,149 B2 * 2/2007 Lin ....................... 361/695
7,265,973 B2 * 9/2007 Lanni .................... 361/695
7,286,346 B2 * 10/2007 Chiba et al. ............ 361/687
7,289,320 B2 * 10/2007 Chang et al. ........... 361/690
7,307,839 B2 * 12/2007 Tse et al. ................ 361/695

\* cited by examiner

*Primary Examiner*—Michael V Datskovskiy
(74) *Attorney, Agent, or Firm*—WPAT, P.C.; Anthony King

(57) ABSTRACT

The cooling function power adapter inserts between the ionization gauge tube prongs and the power socket. Its unique cooling function dissipates the heat generated by the ionization gauge tube working under large power current. This adapter also lowers the working temperature of the power socket. This invention prevents or minimizes the condition where the materials of the power socket carbonize, discolor and/or deteriorate. Additionally, this adopter is designed with easy plug-in and non-directional feature, maintenance and replacement of the adapter take only seconds. This adapter ensures that the power socket is able to working under long periods of time under large power transmission. The fan cooling function further minimizes safety hazards.

6 Claims, 6 Drawing Sheets

COOLING FUNCTION POWER ADAPTER

BACKGROUND OF THE INVENTION

1. Field of the Invention

The present invention relates to a power adapter having a hollow Bakelite-housing, connection pins or prongs passing through the housing, and cooling fan attached on one side or both sides of the main body to dissipate heat. This cooling fan design requires relatively very little power to drive it, and enables forced ventilation on the connection pins of this adopter to cool down heat generated by large power current transmission passing through the adapter. The cooling prevents or minimizes the condition where the Bakelite-housing material can carbonize, discolor, deteriorate and eventually burn out.

This adapter can be used between ionization tube prongs and its power socket or any similarly large power application situation. This adapter not only ensures that the power socket work in lower temperature environment so as to prolong its working life, but also prevents or minimizes fire hazard caused by high working temperature so as to improve system working safety and stability.

2. Description of the Prior Art

The industry utilizing ionization gauge tube to conduct negative pressure or vacuum measure usually has the following features: large power consumption, and long term constant operation requiring remote monitoring. These applications are very popular and are found in the production machineries of semiconductor foundry such as CVD (Chemical Vapor Deposition) machine, PVD (Physical Vapor Deposition) machine, implanter and other industrial application situations.

Typically, in conventional application situations, the power socket linked with power cord through the conduit directly plugs to the ionization gauge tube and enables the operator to remotely monitor its operation. Due to such large power transmission and long term non-stop operation, it accumulates heat generated by large power transmission and keeps the power socket working in relative high temperature environment. It not only cause the material of the power socket to gradually carbonize, discolor, deteriorate and eventually burn out, but also place the entire machine system operation under unsafe and unstable condition. Currently, typical replacement maintenance of such machinery requires not merely un-plugging the socket from the ionization gauge tube, but requires replacement of the whole power cord from the conduit. Since the socket is linked with the power cord, it is impossible to just change the socket and solder the power cord onto socket prongs on site. Eventually, such seemingly simple power socket problem will become costly in time and money to repair.

Such is the case that is always experienced by many conventional products. Aimed at the above depicted defects, the present invention proposes a newly urbanized cooling function power adapter inserted between the ionization gauge tube and its power socket, capable of operating at low temperature resulting in maintenance-free operation for relative long periods of time.

SUMMARY OF THE INVENTION

One major objective of the present invention is aimed at creating an adapter that solves the problem of heat dissipation, It is designed with an hollowed housing that allows connection pins to pass therethrough. The female-terminal of the connection pin serves as a receptacle to accept the prongs of ionization gauge tube to plug in. And, the male-terminal plugs into the socket to form the function of an adapter. With this configuration, it enables the power adapter to fit the ionization gauge tube as in its original design and functions normally without further modification. The cooling fan is attached to the side of the adapter housing to provide ventilation and to cool down the heat generated by large power transmission passing through the connection pins and the power socket. It assures the adapter and the socket to work under relative lower temperature environment and solve the heat dissipation problem. In addition, this design prevents or minimizes the condition where the materials of the adapter and/or socket can carbonize, discolor and deteriorate leading to burn out.

The adapter is maintenance-free therefore obviously reduces system operation down time and cost for repair and maintenance.

BRIEF DESCRIPTION OF THE DRAWINGS

The drawings disclose two illustrative embodiments of the present invention which serve to exemplify the various advantages and objectives hereof, and are as follows.

LIST OF REFERENCE NUMERALS

Figure 1:
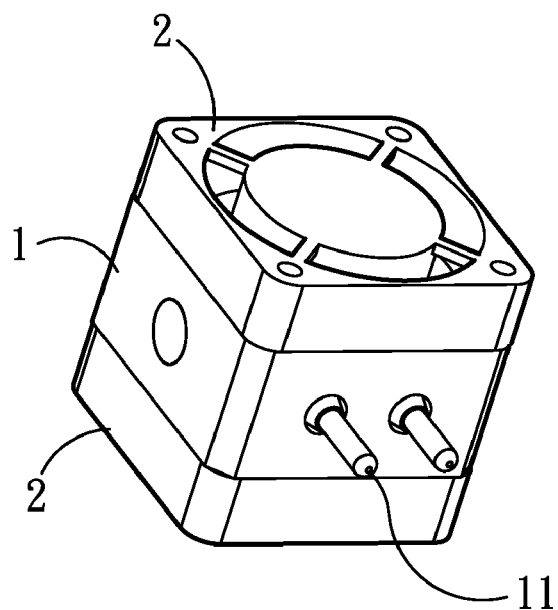
FIG. 1 is a three dimensional view of the present invention.

1 power adapter
2 cooling fan
11 male-terminal of connection pin/plug
12 female-terminal of connection pin/receptacle
13 connection pin/wire
14 rectifier

DETAILED DESCRIPTION OF THE PREFERRED EMBODIMENT

Figure 12:
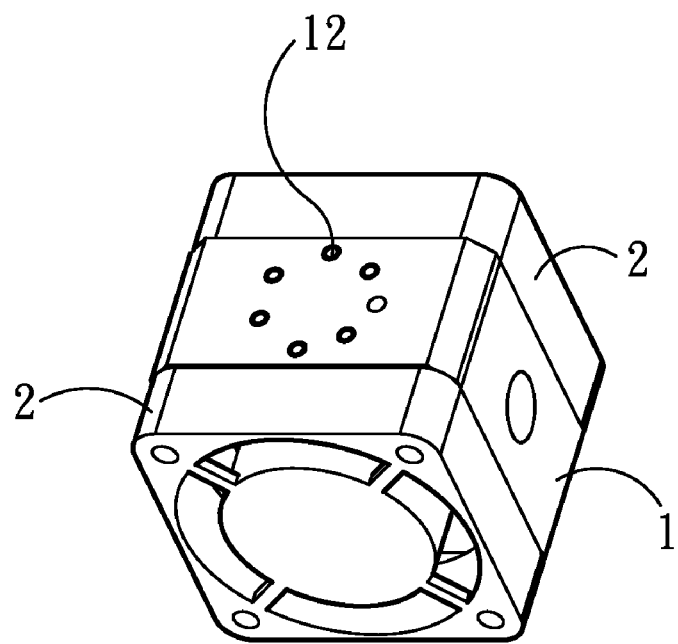
FIG. 12 is another angle of the fifth illustrative three dimensional view of the present invention.

Referring to FIG. 1. through FIG. 12., the present invention as shown has a the cooling fan 2 attached on the side of the power adapter 1. The power adapter is capable of working under large power current transmission situation. The power adapter 1 has one end functioning as plug 11, and another end functioning as receptacle 12. In between the plug 11 and receptacle 12, connection pin or wire is used to accomplish the power connection. The major structure of the present invention has the cooling fan 2 attached on the power adapter 1 either on one side or both sides. The cooling fan's 2 power source is supplied from the power adapter 1. In application, when attaching the power adapter 1 between the ionization gauge tube and its power socket, the prongs of the ionization gauge tube plugs into the receptacle 12 of the power adapter and connects the plug 11 of the power adapter to the socket of the ionization gauge tube. It will automatically power up the cooling fan 2 and then the enforced ventilation will cool down the heat inside the power adapter 1 generated by large current transmission through the socket.

In the present invention, power adapter 1 with this unique cooling function enable the adapter to work for long periods of time without heat dissipation problem. Therefore, the power adapter 1 is suitable for use in any large power transmission circumstance to maintain the working stability and safety, and shall not be limited for use in the ionization gauge tube situation. It could be applied to any plug and socket connection with heat dissipation problem, or situations where heat dissipation is desired.

Above mentioned cooling fan 2 can be AC fan or DC fan. As for the DC fan application, it can place the rectifier 14 on the housing of the power adapter 1 to rectify the AC power picked up from the connection pin 13, to DC and supply to the DC fan.

Figure 2:
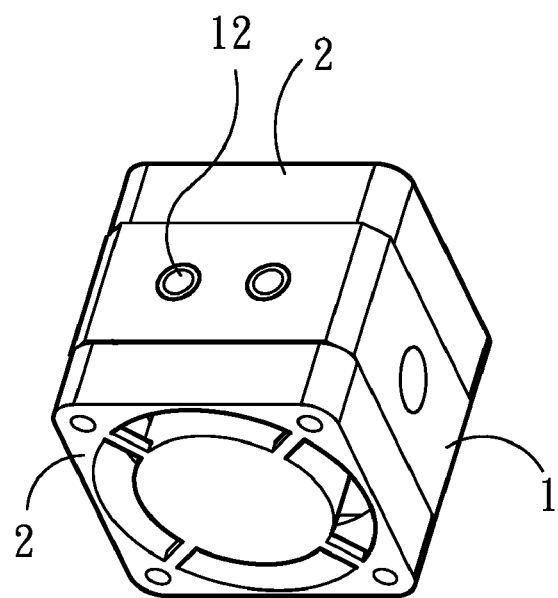
FIG. 2 is another angle of the three dimensional view of the present invention.
Figure 3:
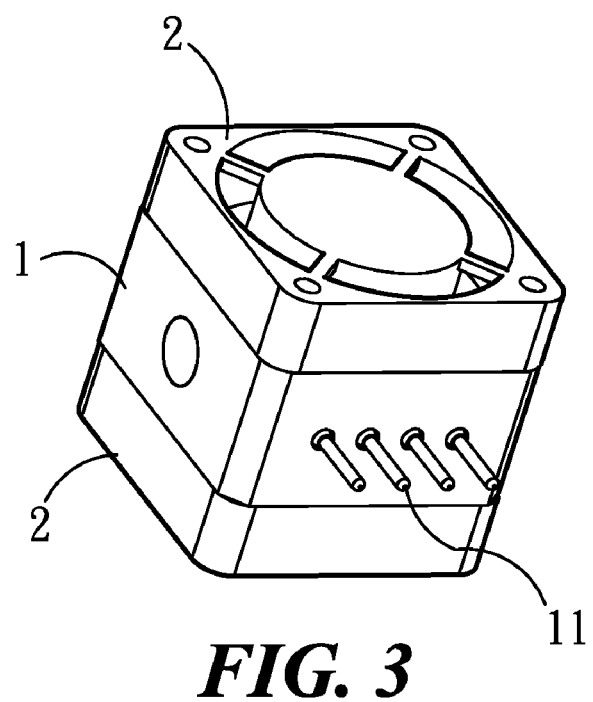
FIG. 3 is the second illustrative three dimensional view of the present invention.
Figure 4:
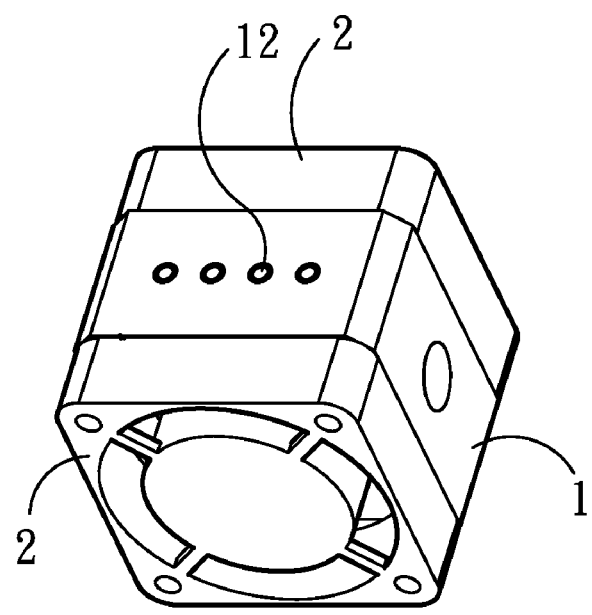
FIG. 4 is another angle of the second illustrative three dimensional view of the present invention.
Figure 5:
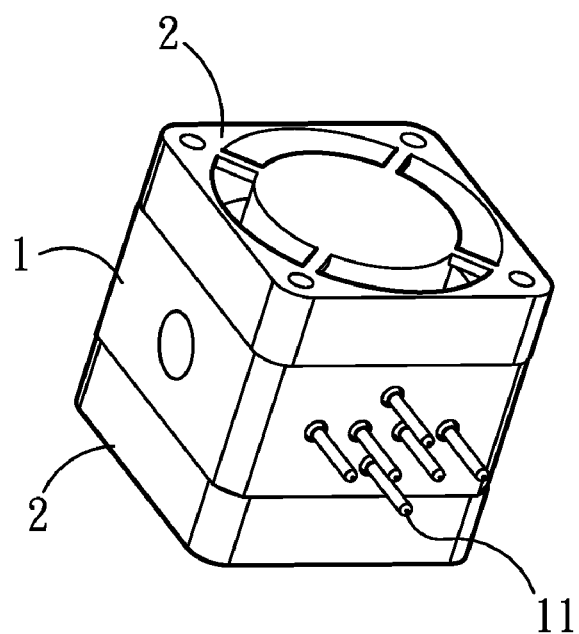
FIG. 5 is the third illustrative three dimensional view of the present invention.
Figure 6:
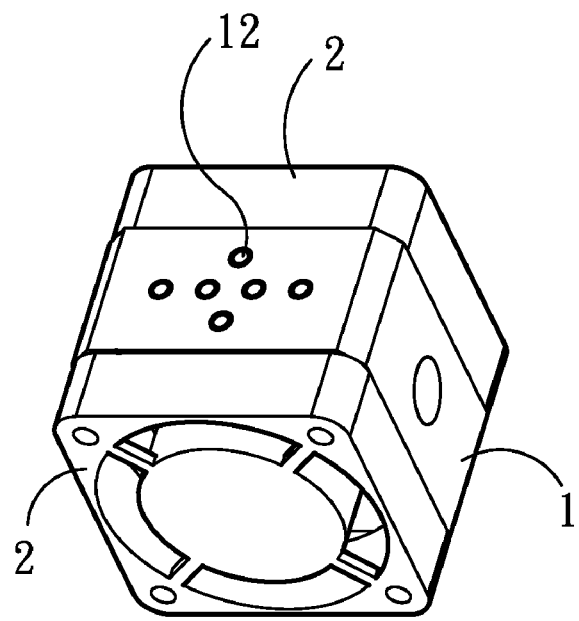
FIG. 6 is another angle of the third illustrative three dimensional view of the present invention.
Figure 8:
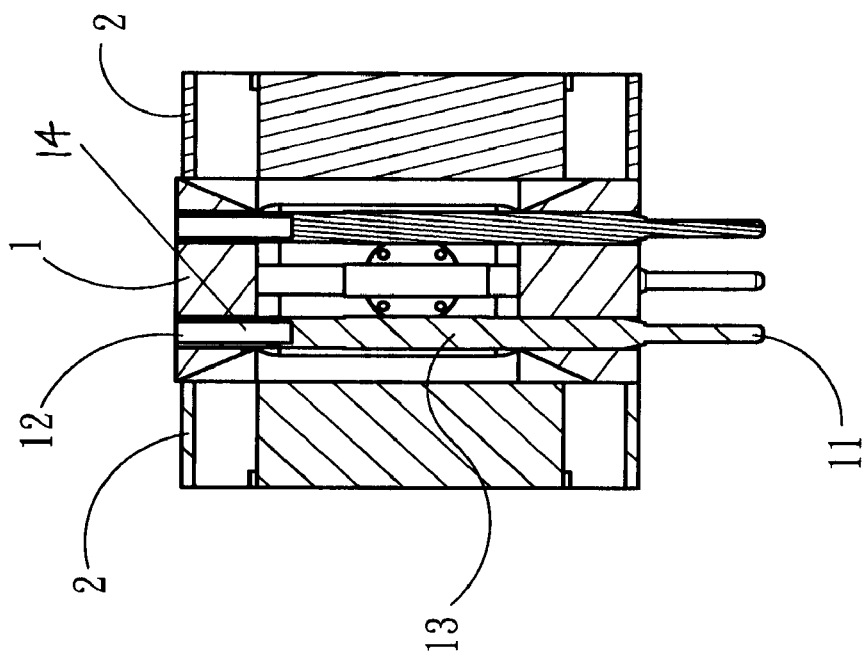
FIG. 8 is A-A cross sectional view of the present invention shown in FIG. 7.
Figure 7:
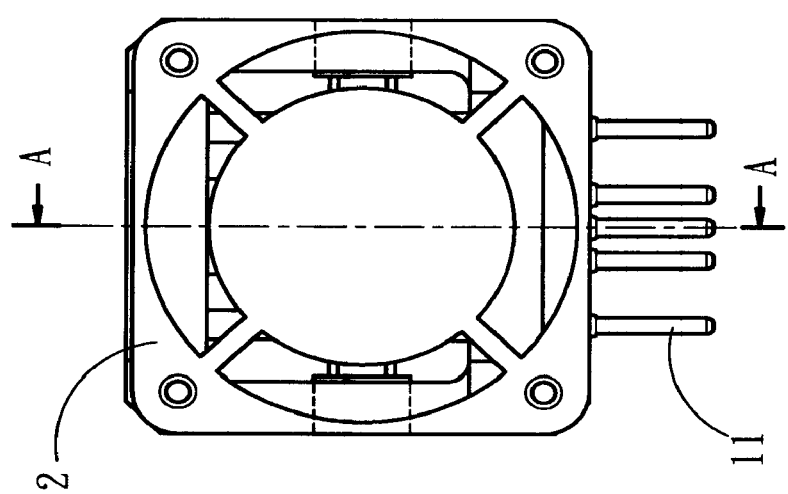
FIG. 7 is the two dimensional structure view of the present invention.
Figure 9:
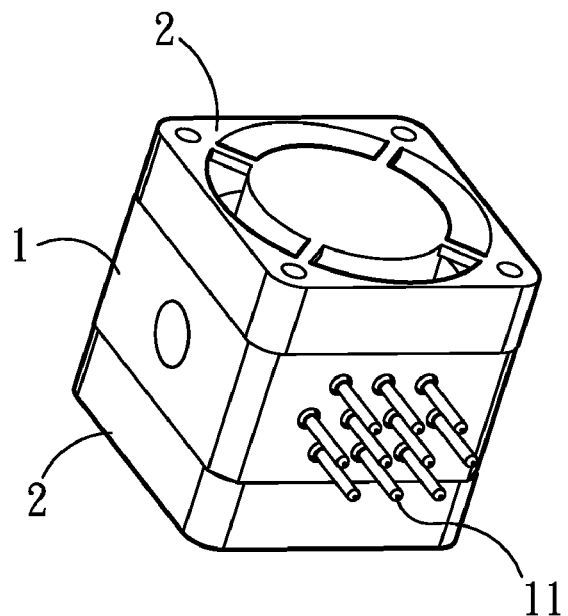
FIG. 9 is the fourth illustrative three dimensional view of the present invention.
Figure 10:
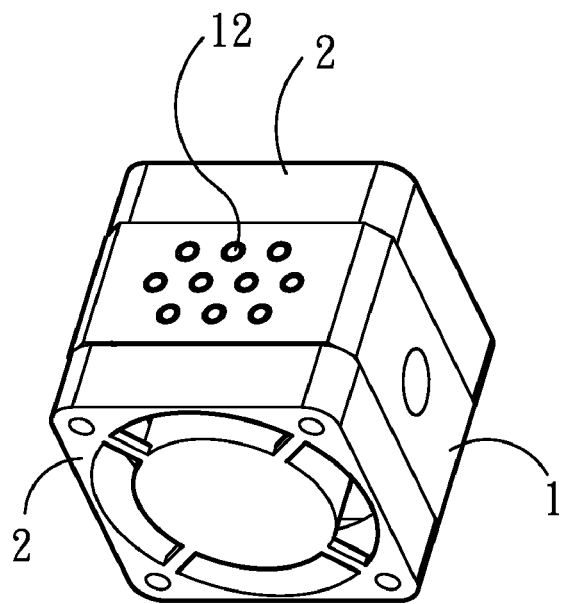
FIG. 10 is another angle of the fourth illustrative three dimensional view of the present invention.
Figure 11:
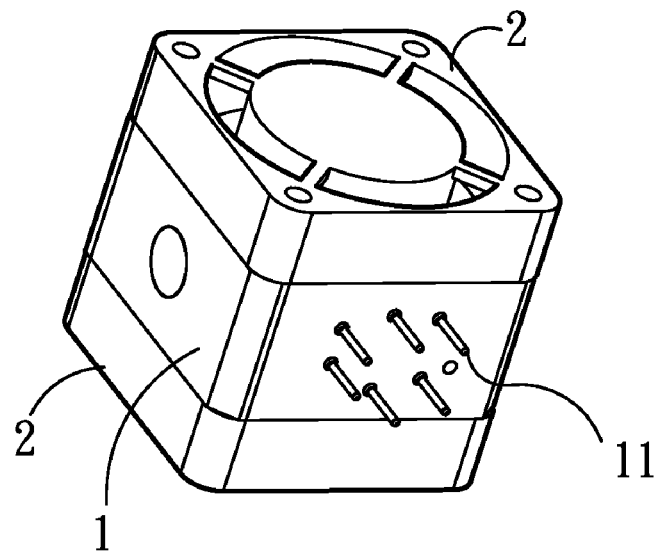
FIG. 11 is the fifth illustrative three dimensional view of the present invention.

Besides, the present invention is not limit to the pin numbers and pin size at the end of plug 11, or in the receptacle end 12. For example, the embodiment in FIG. 1 and FIG. 2 is shown as two-pin type. In FIG. 3 and FIG. 4, four-pin design is shown on the plug 11 and on the receptacle 12 end. As for FIG. 5, FIG. 6, FIG. 7 and FIG. 8, another illustrative view of the present invention is shown on the plug 11 and receptacle 12 end both having six pins, or capable of receiving six pins; In FIG. 9 and FIG. 10, the pin number is ten. In sum, all variations of pin size and numbers of the plug 11 and receptacle 12 are included in the scope of the present invention.

Although the invention has been described in terms of preferred embodiments, it is apparent that numerous variations and modifications may be made without departing from the true spirit and scope thereof as set forth in the following claims.

What is claimed is:

1. A cooling function Ionization Gauge Tube power adapter for inserting between an Ionization Gauge Tube plug and a socket, the power adapter comprising:
    a first side and a second side;
    a cooling fan attached to the first side, the second side, or both the first and the second sides of the power adapter to achieve a heat dissipation function; and
    a connection pin wherein a limited power required by the cooling fan is supplied by the connection pin of the power adapter.

2. The cooling function Ionization Gauge Tube power adapter of claim 1, wherein the power adapter has an AC power fan attached to it.

3. The cooling function Ionization Gauge Tube power adapter of claim 1, wherein the power adapter has a rectifier attached to the power adapter for using a DC cooling fan application.

4. The cooling function Ionization Gauge Tube power adapter of claim 1, wherein the power adapter has a plurality of plugs on a first end of the power adapter and a plurality of receptacles on a second end of the power adapter to enable a multi-coupling of the power adapter to plug in series together to accomplish a power connection.

5. The cooling function Ionization Gauge Tube power adapter of claim 1, wherein the first end and the second end both have a symmetric structure design to enable a connection on the first or the second end as a non-direction adapter.

6. The cooling function Ionization Gauge Tube power adapter of claim 1, wherein the power adapter does not have a receptacle, and the power adapter is directly connected with a power cord to connect with a power source.

* * * * *